United States Patent
Pan et al.

(10) Patent No.: US 7,999,588 B1
(45) Date of Patent: Aug. 16, 2011

(54) DUTY CYCLE CORRECTION CIRCUITRY

(75) Inventors: Mingde Pan, Morgan Hill, CA (US); Shou-Po Shih, Cupertino, CA (US); Mei Luo, San Jose, CA (US); Weiqi Ding, Fremont, CA (US)

(73) Assignee: Altera Corporation, San Jose, CA (US)

( * ) Notice: Subject to any disclaimer, the term of this patent is extended or adjusted under 35 U.S.C. 154(b) by 19 days.

(21) Appl. No.: 12/551,434

(22) Filed: Aug. 31, 2009

(51) Int. Cl.
*H03K 3/017* (2006.01)
(52) U.S. Cl. .................................... 327/175; 327/172
(58) Field of Classification Search .................. None
See application file for complete search history.

(56) References Cited

U.S. PATENT DOCUMENTS

| | | | |
|---|---|---|---|
| 6,337,588 B1 * | 1/2002 | Chen ............................. | 327/122 |
| 6,611,573 B2 * | 8/2003 | Trivedi et al. .................... | 377/48 |
| 6,882,196 B2 * | 4/2005 | Yee et al. ........................ | 327/175 |
| 7,015,747 B2 * | 3/2006 | Kim ................................ | 327/552 |
| 7,375,563 B1 * | 5/2008 | Cheung et al. ................. | 327/156 |
| 7,705,649 B1 * | 4/2010 | Yu et al. ......................... | 327/175 |
| 7,777,543 B2 * | 8/2010 | Park ................................ | 327/175 |
| 2004/0000935 A1 * | 1/2004 | El-Kik ........................... | 327/116 |

* cited by examiner

*Primary Examiner* — Cassandra Cox
(74) *Attorney, Agent, or Firm* — Martine Penilla & Gencarella, LLP

(57) ABSTRACT

Circuits and a method for tuning an integrated circuit (IC) are disclosed. The IC includes a storage circuit coupled to receive a data signal, a clock input signal and a reset signal. The storage circuit may be used to generate a clock signal. The reset signal is supplied by a reset circuit. The reset circuit may include one or more logic gates to generate the reset signal. The reset circuit receives a phase shifted version of the clock input signal and the reset signal is generated based on the phase shifted version of the clock input signal. In one embodiment, the reset signal is a series of pulses generated at specific intervals to shift the output of the storage circuit from logic high level to logic low level.

21 Claims, 5 Drawing Sheets

DUTY CYCLE CORRECTION CIRCUITRY

BACKGROUND

Quadrature clocks are widely used in many applications such as a phase interpolator and a half-rate clock data recovery (CDR) circuit. The generated quadrature clocks are required to be in symmetrical or equally divided phases. In other words, each clock period needs to have equal high and low periods, or an approximately 50% duty cycle. In a rectangular waveform, a 50% duty cycle can be described as the percentage of the full cycle that the signal remains at logic 1. For instance, if the signal spends half the clock period at logic 1 and the other half at logic 0, then the waveform generated would be a waveform with a 50% duty cycle.

Usually, the 50% duty cycle is achieved by doubling the clock rate or increasing the frequency of the clock rate before dividing the clock rate by 2. However, in high speed designs where the output clocks are already running at a high frequency, e.g., 5 GHz and above, such a method is not feasible because it is very difficult, or even impossible, to double an already high frequency clock. Furthermore, by dividing the clock rate, this method would slow down the system clock considerably. Another method is to couple a pair of positive feedback inverters to a pair of clocks running at opposite phases. However, this method is inadequate because it has a limited correction range and the inverters used invariably increase the power consumption of the circuit.

The duty cycle of each clock also depends on the process, temperature and supply voltage. Therefore, clock duty cycle correction circuits or methods need to perform consistently across a wide range of processes, voltages and temperatures, i.e., duty cycle correction circuits that correct output clocks to 50%, or close to 50%, duty cycle should be reliable across all PVT (Process, Supply Voltage, Temperature) corners.

Therefore, it is desirable to have a consistent duty cycle correction or clock tuning circuit that that does not necessarily speed up or slow down the clock rate and can correct severe duty cycle offsets without a significant increase in power consumption. It is within this context that the invention arises.

SUMMARY

Embodiments of the present invention include circuits and a method for tuning a clock signal in an integrated circuit (IC).

It should be appreciated that the present invention can be implemented in numerous ways, such as a process an apparatus, a system, a device or a method on a computer readable medium. Several inventive embodiments of the present invention are described below.

In one embodiment, an IC with a storage circuit is disclosed. The storage circuit has three input terminals. The first input terminal is coupled to receive a data signal, the second input terminal is coupled to receive a clock signal and the third input terminal is coupled to receive a reset signal. A reset circuit that generates the reset signal is coupled to the third input terminal. The reset circuit receives a phase shifted version of the clock signal. In one embodiment, the clock signal received by the reset circuit is shifted by approximately 180 degrees from the clock signal received by the storage circuit. The reset signal is generated at specific intervals based on the phase shifted version of the clock signal. The storage circuit generates a clock output signal with substantially equal logic high and logic low periods by modifying the clock input signal according to the reset signal.

In an alternative embodiment in accordance with the present invention, a method of operating an IC to generate a clock cycle having a substantially even duty cycle from a clock cycle that has an uneven duty cycle is provided. The method includes receiving a first clock signal. A second clock signal which is substantially 180 degrees out of phase with the first clock signal is also received. A delay is applied to the second clock signal in order to generate a third clock signal based on the second clock signal. An output clock signal is generated based on the first clock signal. The output clock signal is generated by adjusting the first clock signal according to a reset signal that is a product of the second clock signal and the third clock signal.

In yet another embodiment in accordance with the present invention, a duty cycle correction circuit is provided. The circuit includes a flip flop. The flip flop has a data input terminal that receives a logic high signal, a clock input terminal that receives a clock input signal, and a reset terminal that receives a reset signal. A reset circuit generates the reset signal to reset the flip flop based on the phase shifted version of the clock input signal. The flip flop modifies the clock input signal according to the reset signal to generate a clock output signal having substantially even duty cycle. In one embodiment, the waveform of the clock output signal is a substantially symmetrical waveform derived from the clock input signal, which has an uneven duty cycle Other aspects of the invention will become apparent from the following detailed description, taken in conjunction with the accompanying drawings, illustrating by way of example the principles of the invention.

BRIEF DESCRIPTION OF THE DRAWINGS

The invention may best be understood by reference to the following description taken in conjunction with the accompanying drawings in which.

DETAILED DESCRIPTION

The following embodiments describe circuits and a method for tuning an integrated circuit (IC).

It will be obvious, however, to one skilled in the art, that the present invention may be practiced without some or all of these specific details. In other instances, well-known operations have not been described in detail in order not to unnecessarily obscure the present invention.

The embodiments described herein provide techniques to create an IC with a clock duty cycle correction circuit that outputs a clock with approximately 50% duty cycle across all PVT ranges. It should be appreciated that in high speed quadrature system, i.e., a system running above 1 GHz, the voltage-controlled oscillator (VCO) output clocks may not have a 50%, or close to 50%, duty cycle. As one skilled in the art should know, quadrature clocks are widely used in many applications such as phase interpolators, CDR circuits and VCOs. A 50% duty cycle is important for high frequency devices or high-speed applications because the clocks need to be synchronized as some devices are triggered with the rising edges while others are triggered with the falling edges. Asymmetric duty cycles will make the synchronization of all the clocks in a system more difficult. The disclosed embodiments provide a duty cycle correction circuit that is operable across all PVT ranges to generate clock signals with a 50% duty cycle. One embodiment describes a duty cycle correction circuit in an IC that is capable of generating a substantially 50% duty cycle. The duty cycle correction circuit uses two clocks with opposite phases to generate a symmetrical, or at least close to symmetrical, output clock signal.

Figure 1:
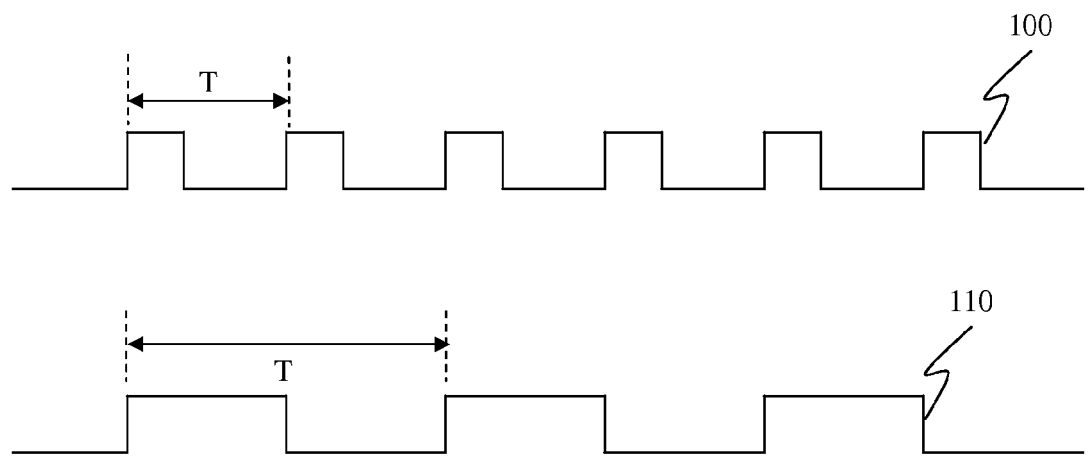
FIG. 1 shows an exemplary waveform of a clock signal with an uneven duty cycle and an exemplary waveform of a clock signal with an even duty cycle.

FIG. 1 shows exemplary waveform 100 of an asymmetrical clock signal and waveform 110 of a symmetrical clock signal. Waveform 100 has an uneven period of high and low for each clock period. Interval T as shown on waveform 100 is the clock period of the clock signal. One skilled in the art understands that one clock period refers to the period from one rising/falling edge to the next rising/falling edge. The duty cycle parameter specifies the relative duration of the logic high output during each clock period. As shown in waveform 100 of FIG. 1, each clock period T has a relatively shorter logic high duration compared to its logic low duration. As explained before, a symmetrical clock signal has a substantially 50% duty cycle. In other words, each clock period T should have an equal, or almost equal, duration of logic high and logic low outputs. Exemplary waveform 110 of FIG. 1 shows a symmetrical clock signal. Each clock period T on waveform 110 has an even duration of high and low outputs. As such, waveform 110 is a waveform of a symmetrical clock signal with a 50% duty cycle.

Figure 2:
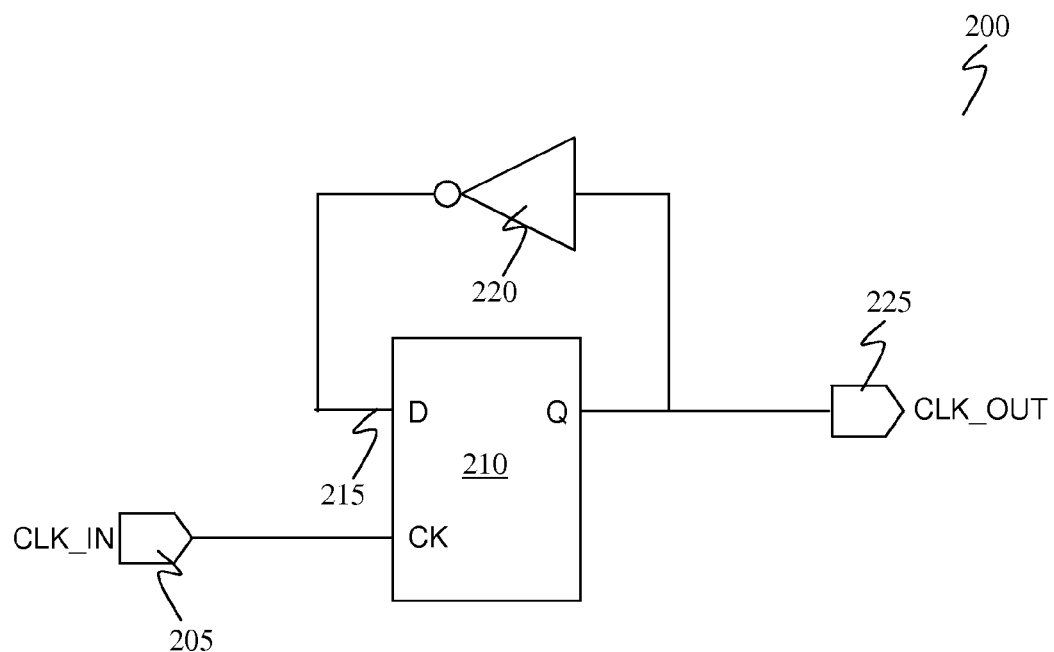
FIG. 2, meant to be illustrative and not limiting, shows an exemplary circuit for dividing the rate of a clock signal.

FIG. 2, meant to be illustrative and not limiting, shows exemplary circuit 200 for dividing the rate of a clock signal. Storage element or storage circuit 210 receives clock input signal 205 and outputs clock signal 225. Clock input signal 205 and clock output signal 225 may be represented by waveforms 100 and 110, respectively, in the illustrative embodiment of FIG. 1. In one embodiment, clock input signal 205 is a system clock with its frequency doubled. Inverter or buffer 220, which is placed in between the feedback path from the output of storage element 210 to input terminal 215 of storage element 210, divides clock input signal 205 by 2. In other words, the frequency of clock input signal 205 is doubled and then decreased by half before clock output signal 225, with a close to 50% duty cycle, is generated.

Figure 3:
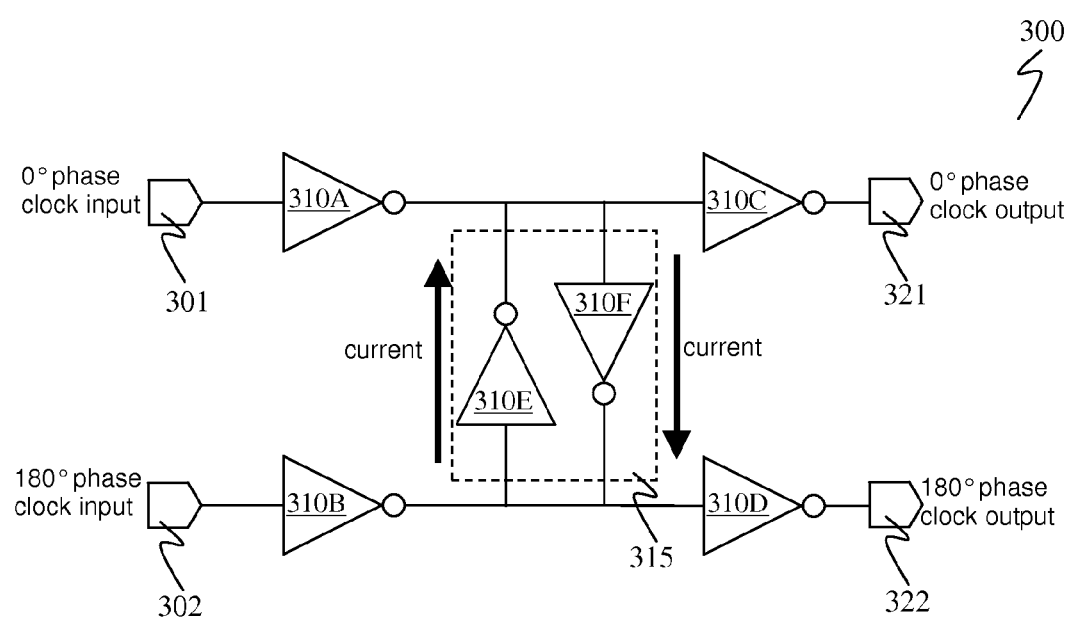
FIG. 3, meant to be illustrative and not limiting, shows an exemplary circuit with cross-coupled inverters.

FIG. 3, meant to be illustrative and not limiting, shows exemplary circuit 300 with cross-coupled inverters 310E and 310F. In this instance, two complementary clocks are used. The two clocks as shown in FIG. 3 have opposite phases. In the embodiment of FIG. 3, clock input signal 301 is a 0° phase clock signal and clock input signal 302 is a 180° phase clock signal. Clock input signals 301 and 302 are coupled together with a pair of positive feedback inverters, 310E and 310F, coupled together to form back-to-back inverters 315. Although clock output signals 321 and 322 generated by circuit 300 have approximately 50% duty cycles, circuit 300 has a limited correction range and circuit 300 may consume more power because of the extra inverters used, i.e., positive feedback inverters 310E and 310F, to couple the two clock input signals. Furthermore, inverters 310A and 310C, and inverters 310B and 310D, placed between clock input signal 301 and clock output signal 321 and clock input signal 302 and clock output signal 322, respectively, may also increase jitter in the circuit.

Figure 4:
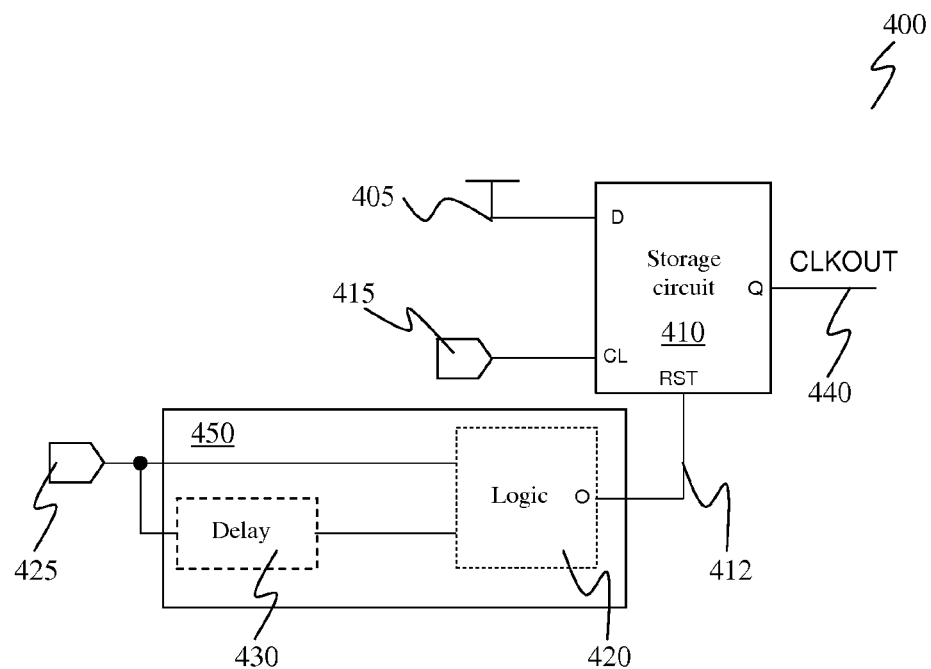
FIG. 4, meant to be illustrative and not limiting, shows a clock circuit coupled to a reset circuit as an embodiment of the present invention.

FIG. 4, meant to be illustrative and not limiting, shows clock circuit 400 with reset circuit 450 as an embodiment of the present invention. Storage circuit 410 in circuit 400 is coupled to receive clock input signal 415. In one embodiment, clock input signal 415 is a system clock. One skilled in the art should appreciate that storage circuit 410 refers to all kinds of storage circuits, such as latches, flip flops, etc., that are generally used in ICs. The illustrative embodiment of FIG. 4 shows an edge-triggered storage circuit, i.e., D flip flop 410, that accepts and registers data signal 405 received at the data input terminal at every rising and/or falling edge of clock input signal 415. Data signal 405 is coupled to an input terminal of storage circuit 410. In one embodiment, data signal 405 is a logic high signal. In another embodiment, data signal 405 is a positive voltage level that originates from a power supply.

A reset terminal of storage circuit 410 of FIG. 4 is coupled to reset circuit 450. The reset terminal receives reset signal 412, which is an asynchronous reset in that the reset signal is independent of clock input signal 415. In one embodiment reset signal 412 resets storage circuit 410 instantaneously. Reset circuit 450 receives clock input signal 425, which is a phase shifted version of clock input signal 415. Reset circuit 450 generates reset signal 412 based on clock input signal 425 and a delayed version of clock input signal 425. Delay module 430 generates the delayed version of clock input signal 425 and logic module 420 logically combines clock input signal 425 and the delayed version of clock input signal 425 to generate reset signal 412. The details of logic module 420 and delay module 430 are provided below with reference to FIG. 5.

In an exemplary embodiment, clock input signal 425 is a 180° phase shifted version of clock input signal 415. Storage circuit 410 generates a clock output signal, CLKOUT 440, based on clock input signal 415 and reset signal 412. In an exemplary embodiment, CLKOUT 440 has a substantially 50% duty cycle due to the features of the embodiments described herein.

Figure 5:
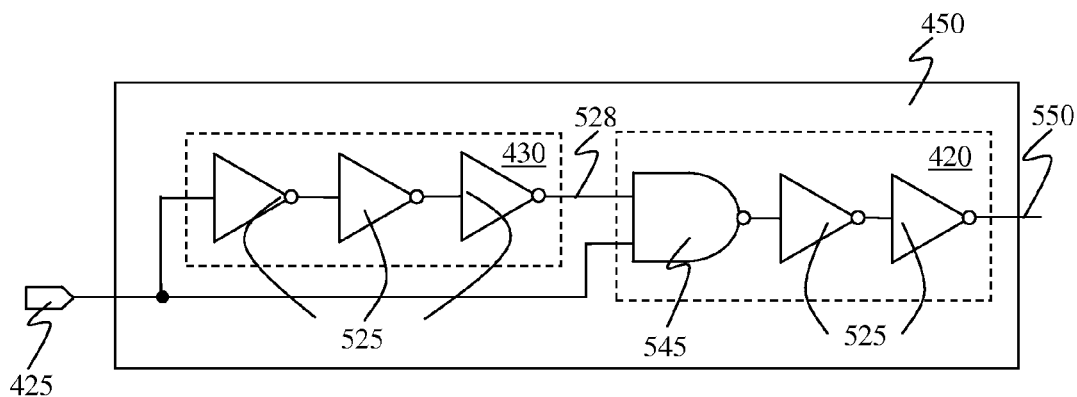
FIG. 5, meant to be illustrative and not limiting, shows a detailed representation of an exemplary reset circuit as an embodiment in accordance with the present invention.

FIG. 5, meant to be illustrative and not limiting, shows a detailed representation of reset circuit 450 as an embodiment in accordance with the present invention. As shown in FIG. 5, clock input signal 425 is coupled to delay circuit 430 and logic block 420 in reset circuit 450. Delay circuit 430 includes a plurality of buffers 525 connected in series. In one embodiment, buffers 525 are inverters. Even though three buffers 525 are shown in delay circuit 430, one skilled in the art should appreciate that the required number of buffers may vary for different applications as FIG. 5 is an illustrative example and not meant to be limiting. Thus, more or fewer buffers 525 can be used in delay circuit 430. Delay circuit 430 generates a delayed version of clock input signal 425 as output 528. Logic block 420 receives output 528 from delay circuit 430 and clock input signal 425. In one embodiment, logic block 420 includes logic gate 545 and multiple buffers or inverters 525. In an exemplary embodiment, logic gate 545 is a NAND gate.

However, alternative logic gates may be utilized to logically combine output 528 and clock input signal 425 to generate reset signal 425. In one embodiment, inverters 525 are used to create a sharper pulse for reset signal 412. As explained in more detail below, reset signal 412 may be utilized to pull the clock input signal 415 of FIG. 4 up or down so that CLKOUT 440 has a substantially even duty cycle.

Figure 6:
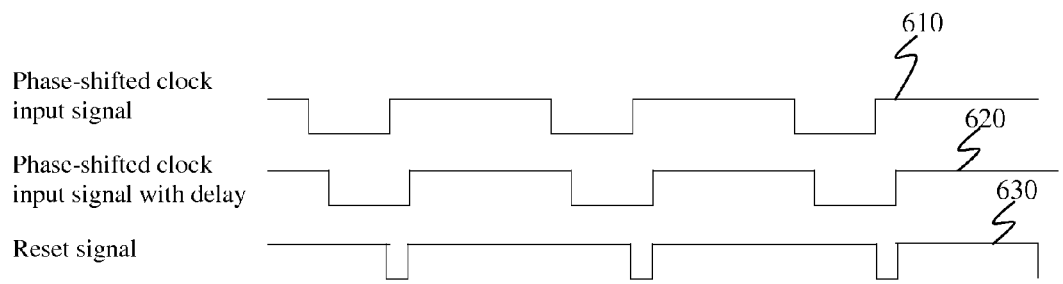
FIG. 6, meant to be illustrative and not limiting, shows exemplary waveforms that describe the relationship between the reset signal, the phase shifted clock input signal and the delayed version phase shifted clock input signal.

FIG. 6, meant to be illustrative and not limiting, shows exemplary waveforms 610, 620 and 630 that illustrate the relationship between the reset signal, the phase shifted clock input signal and the delayed version phase shifted clock input signal. Waveform 610 is an exemplary waveform of a phase shifted clock input signal and waveform 620 is an exemplary waveform of the phase shifted clock input signal with delay. Phase shifted clock input signal 610 corresponds to clock input signal 425 of FIG. 4 and the phase shifted clock input signal with delay 620 corresponds to output 528 generated by delay circuit of FIG. 5. Waveform 630 shows the generated reset signal based on the output from logic block 420 of FIG. 4, which receives the phase shifted clock input signal 610 and the phase shifted clock input signal with delay 620. In the illustrative embodiment of FIG. 6, the reset signal as represented by waveform 630 is an active-low signal. In another embodiment, the logic low pulse of the reset signal should be long enough to be registered by storage circuit 410 of FIG. 4. In yet another embodiment, the width of the logic low pulse is determined by the amount of delay applied on the phase shifted clock input through the delay circuitry.

In the exemplary embodiment of FIG. 6, the reset signal or pulse can be represented by the Boolean equation: ~RSTN=PSC*~PSCD, where ~RSTN refers to the active-low reset signal, PSC represents the phase shifted clock input signal and ~PSCD represents a NOT delayed version of the phase shifted clock input signal. In other words, the reset signal is active when the phase shifted clock input signal is at a logic high level and when the delayed version of the phase shifted clock input signal is at a logic low level. One skilled in the art should appreciate that the reset signal may be an active-high reset signal in an alternative embodiment. In this alternative embodiment, the reset signal is represented by the logically equivalent Boolean equation: RSTN=~PSC+PSCD, where the reset signal is active when the phase shifted clock input signal is at a logic low level and when the delayed version of the phase shifted clock input signal is at a logic high level. Logic module 420 of FIG. 5 provides the circuitry to achieve the functionality of the Boolean equation for an active low reset signal in one embodiment. It should be appreciated that alternative logic gate combinations may be implemented within the logic module to achieve the functionality required for a particular application.

Figure 7:
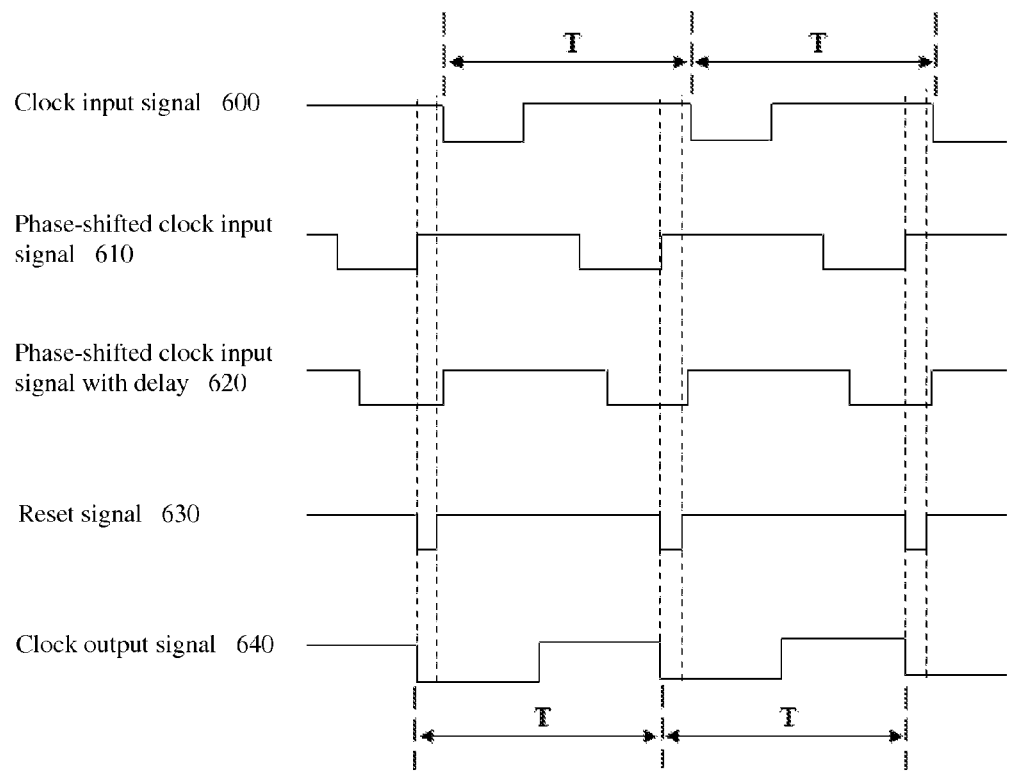
FIG. 7, meant to be illustrative and not limiting, shows multiple exemplary waveforms to illustrate the connection between the clock input signal, the phase shifted version of the clock input signal, the reset signal and the clock output signal.

FIG. 7, meant to be illustrative and not limiting, shows multiple exemplary waveforms to illustrate the relationship between the clock input signal, the phase shifted version of the clock input signal, the reset signal and the clock output signal. As shown in FIG. 7, the clock input signal does not have a 50% duty cycle as each clock period, T, does not have an equal period of logic high and logic low levels. In this illustrative embodiment, the clock input signal has a substantially longer logic high period in each clock period, T. The clock output signal as shown in FIG. 7 is generated based on the clock input signal and the reset signal. The clock output signal is the "corrected" version of the clock input signal and has a substantially 50% duty cycle, i.e., equal periods of high and low logic levels. As illustrated by the dotted lines in FIG. 7, the logic low period in each clock period of clock input signal is "lengthened" such that each clock period has substantially equal periods of logic high and logic low. The logic low pulses of the reset signal, in this case, pull the clock input signal down to generate a clock output signal having a substantially 50% duty cycle. Each clock period, T, of the clock output signal has a substantially 50% duty cycle. In one embodiment, the clock output signal has a duty cycle that is not worse than a ratio of 49% to 51%.

Still referring to FIG. 7, the relative ease of implementation for the circuit should be appreciated in that the rising edge of clock output signal 640 is aligned, i.e., occurs contemporaneously, with the rising edge of clock input signal 600. Similarly, the falling edge of the clock output signal is aligned with the rising edge of phase shifted clock input signal 610. The phase shifted clock input signal is phase shifted, e.g., by 180 degrees, relative to the clock input signal 600. Reset signal 630 has a falling edge aligned with the rising edge of phase shifted clock input signal 610 and a rising edge aligned with the falling edge of Phase-shifted clock input signal with delay 620. It should be appreciated that the minimum width for the logic low level pulse of the reset signal is controlled by the setup time for the storage circuit required to see the pulse of the reset signal.

Figure 8:
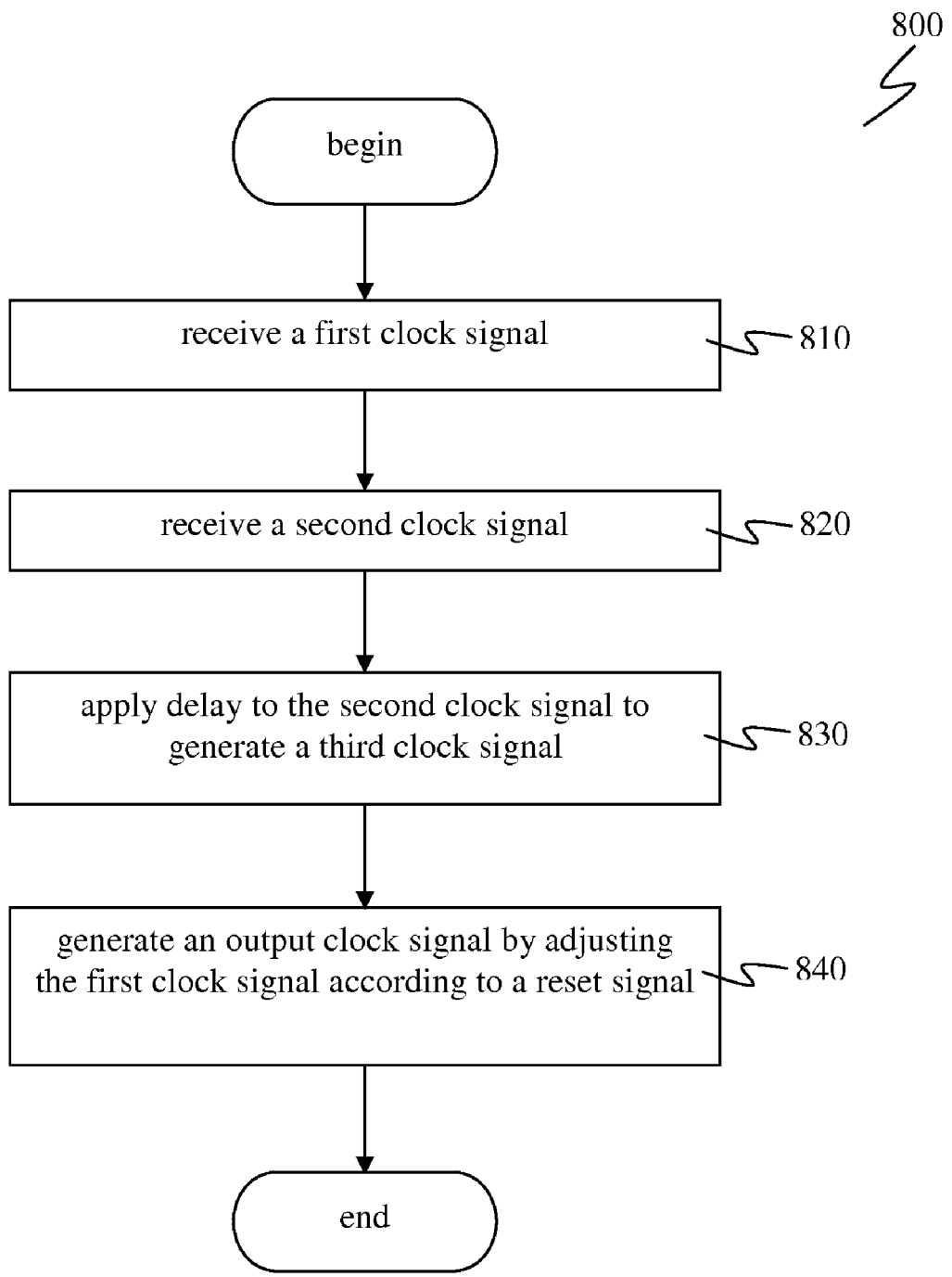
FIG. 8, meant to be illustrative and not limiting, is a simplified flow chart showing a method for operating an integrated circuit (IC) as another embodiment in accordance with the present invention.

FIG. 8, meant to be illustrative and not limiting, is a simplified flow chart that shows method flow 800 for operating an IC as another embodiment in accordance with the present invention. A first clock signal is received in operation 810 and a second clock signal is received in operation 820. In one embodiment, the second clock signal is substantially 180° out of phase with the first clock signal. As described above, the first clock signal is the input clock signal and has a duty cycle that is uneven. A delay is applied to the second clock signal to generate a third clock signal in operation 830. An output clock signal is generated in operation 840. The output clock signal is generated by adjusting the first clock signal according to a reset signal that is a product of the second clock signal and the third clock signal. In the illustrative embodiment of FIG. 7, the first clock signal is the clock input signal, the second clock signal is the phase shifted version of the clock input signal and the third clock signal is the phase shifted clock signal with delay. Accordingly, the input clock signal is modified in conjunction with the reset signal, thereby generating the clock output signal. That is, the reset signal pulls down the clock input signal to define the falling edge of the clock output signal. The reset signal is generated by gating the phase shifted clock signal and the phase shifted clock signal with delay as described above with reference to FIGS. 5-7. The clock output signal has a substantially even duty cycle, i.e., a 50% duty cycle, as opposed to the uneven duty cycle of the clock input signal.

Using a reset circuit and two clocks with different phases is a relatively cost-effective solution to generate a clock output signal with a substantially 50% duty cycle. The described embodiments can generate an almost symmetrical clock signal without changing the rate of the system clock or the system speed. Inconsistencies measured across different PVT corners are also cancelled by the use of two input clocks that are approximately 180 degrees out of phase with each other. Therefore, the described embodiments can be used in most quadrature clock systems, e.g., voltage-controlled oscillators (VCOs), phase interpolators, etc., to generate clocks with 50%, or close to 50%, duty cycles.

The embodiments, thus far, were described with respect to integrated circuits. The method and apparatus described herein may be incorporated into any suitable circuit. For example, the method and apparatus may be incorporated into numerous types of devices such as microprocessors or programmable logic devices. Exemplary programmable logic devices include programmable array logic (PAL), programmable logic array (PLA), field programmable logic array (FPLA), electrically programmable logic devices (EPLD), electrically erasable programmable logic device (EEPLD), logic cell array (LCA), field programmable gate array (FPGA), application specific standard product (ASSP), application specific integrated circuit (ASIC), just to name a few.

The programmable logic device described herein may be part of a data processing system that includes one or more of the following components; a processor; memory; I/O circuitry; and peripheral devices. The data processing system can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system. In one embodiment, the programmable logic device may be one of the family of devices owned by the assignee.

Although the method operations were described in a specific order, it should be understood that other operations may be performed in between described operations, described operations may be adjusted so that they occur at slightly different times or described operations may be distributed in a system which allows the occurrence of the processing operations at various intervals associated with the processing, as long as the processing of the overlay operations are performed in a desired way.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. An integrated circuit (IC), comprising:
    a storage circuit having a first input, a second input and a third input, wherein the first input is coupled to receive a data signal, the second input is coupled to receive a clock input signal and the third input is coupled to receive a reset signal; and
    a reset circuit coupled to receive a phase shifted version of the clock input signal, the clock input signal and the phase shifted version of the clock input signal are substantially 180 degrees out of phase alignment, wherein the reset circuit is operable to generate the reset signal, the reset signal operable to reset the storage circuit at specific intervals based on the phase shifted version of the clock input signal, the storage circuit operable to modify the clock input signal according to the reset signal, wherein the storage circuit is operable to generate a clock output signal having substantially equal high and low periods.

2. The IC of claim 1, wherein the reset signal is operable to pull the clock input signal to a logic low level when the reset signal is at a logic low level.

3. The IC of claim 1, wherein the storage circuit is a flip flop.

4. The IC of claim 1, wherein the reset circuit comprises:
    a delay circuit coupled to receive the phase shifted version of the clock input signal, the delay circuit operable to generate a delayed version of the phase shifted version of the clock input signal; and
    a logic gate operable to receive the phase shifted version of the clock input signal and the delayed version of the phase shifted version of the clock input signal, the logic gate operable to generate the reset signal.

5. The IC of claim 4, wherein the delay circuit comprises a plurality of inverters coupled in series.

6. The IC of claim 4, wherein the logic gate is a NAND gate.

7. The IC of claim 1, wherein the reset signal is asynchronous with the clock input signal.

8. The IC of claim 1, wherein the data signal is set at a logic high level.

9. A duty cycle correction circuit, comprising:
    a storage element having a data input terminal coupled to receive a logic signal, a clock input terminal coupled to receive a clock input signal and a reset terminal coupled to receive a reset signal, the reset signal generated by the reset circuit is an active low signal; and
    a reset circuit operable to receive a phase shifted version of the clock input signal, wherein the reset circuit is operable to generate the reset signal to reset the storage element based on the phase shifted version of the clock input signal, and wherein the storage element is operable to modify the clock input signal according to the reset signal to generate a clock output signal having a substantially even duty cycle.

10. The duty cycle correction circuit of claim 9, wherein the storage element is a D flip flop.

11. The duty cycle correction circuit of claim 9, wherein the reset circuit includes a delay circuit.

12. The duty cycle correction circuit of claim 9, wherein the phase shifted version of the clock input signal and the clock input signal are substantially 180 degrees out of phase alignment.

13. The duty cycle correction circuit of claim 9, wherein the logic signal is a positive voltage level.

14. The duty cycle correction circuit of claim 9, wherein the reset circuit comprises:
    a plurality of inverters coupled in series, the plurality of inverters operable to receive the phase shifted version of the clock input signal to generate a delayed version of the phase shifted version of the clock input signal; and
    a logic element operable to receive the phase shifted version of the clock input signal and the delayed version of the phase shifted version of the clock input signal, the logic element operable to generate the reset signal.

15. The duty cycle correction circuit of claim 14, wherein the logic element is a NAND gate.

16. The duty cycle correction circuit of claim 9, wherein the reset signal is asynchronous with the clock input signal.

17. A method of operating an integrated circuit (IC), comprising:
    receiving a first clock signal;
    receiving a second clock signal, wherein the second clock signal is 180 degrees out of phase with the first clock signal;
    applying a delay to the second clock signal to generate a third clock signal;
    generating an output clock signal by adjusting the first clock signal according to a reset signal that is a product of the second clock signal and the third clock signal.

18. The method of claim 17, wherein the output clock signal has duty cycle that is different than that of the first clock signal.

19. The method of claim 17, further comprising:
gating the second clock signal and the third clock signal through a logic module.

20. The method of claim 17, wherein a rising edge of the output clock signal occurs contemporaneously with a rising edge of the first clock signal and a falling edge of the output clock signal occurs contemporaneously with a rising edge of the second clock signal.

21. The method of claim 17, further comprising:
applying the second and third clock signals to a NAND gate to generate the reset signal.

* * * * *